United States Patent
Kim et al.

(10) Patent No.: US 7,812,357 B2
(45) Date of Patent: Oct. 12, 2010

(54) LED HAVING VERTICAL STRUCTURE AND METHOD FOR FABRICATING THE SAME

(75) Inventors: Jong Wook Kim, Gyeonggi-do (KR); Jae Wan Choi, Seoul (KR); Hyun Kyong Cho, Seoul (KR); Jong Ho Na, Seoul (KR); Jun Ho Jang, Gyeonggi-do (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 242 days.

(21) Appl. No.: 11/639,430

(22) Filed: Dec. 15, 2006

(65) Prior Publication Data
US 2007/0164298 A1 Jul. 19, 2007

(30) Foreign Application Priority Data
Dec. 15, 2005 (KR) ............... 10-2005-0123857
Jul. 6, 2006 (KR) ............... 10-2006-0063586

(51) Int. Cl.
*H01L 29/22* (2006.01)

(52) U.S. Cl. .............. 257/94; 257/79; 257/95; 257/98; 257/E33.005; 257/E33.067; 257/E33.072; 257/E33.073

(58) Field of Classification Search ........ 257/98, 257/79, 94, 95, E33.005, E33.067, E33.072, 257/E33.073
See application file for complete search history.

(56) References Cited

U.S. PATENT DOCUMENTS

| | | | |
|---|---|---|---|
| 6,229,160 B1 * | 5/2001 | Krames et al. .......... | 257/94 |
| 6,429,462 B1 | 8/2002 | Shveykin | |
| 6,878,563 B2 | 4/2005 | Bader et al. | |
| 6,946,687 B2 | 9/2005 | Eisert et al. | |
| 2004/0026700 A1 * | 2/2004 | Akaike et al. .......... | 257/79 |
| 2004/0033638 A1 * | 2/2004 | Bader et al. ........... | 438/46 |
| 2005/0202682 A1 | 9/2005 | Kiyoku et al. | |
| 2005/0280352 A1 * | 12/2005 | Lai .................... | 313/498 |
| 2006/0065901 A1 * | 3/2006 | Aoyagi et al. .......... | 257/79 |
| 2006/0097274 A1 * | 5/2006 | Lee et al. ............. | 257/98 |

FOREIGN PATENT DOCUMENTS

| | | |
|---|---|---|
| CN | 1336012 | 2/2002 |
| CN | 1471733 | 1/2004 |
| EP | 0397911 | 11/1990 |
| EP | 0961328 A2 | 12/1999 |
| JP | 10-093136 | 4/1998 |
| JP | 2002-261014 | 9/2002 |
| TW | 277111 | 10/2005 |

* cited by examiner

*Primary Examiner*—Andy Huynh
(74) *Attorney, Agent, or Firm*—McKenna Long & Aldridge LLP

(57) ABSTRACT

A light emitting diode (LED) having a vertical structure and a method for fabricating the same. The light emitting diode (LED) having a vertical structure includes a support layer; a first electrode formed on the support layer; a plurality of semiconductor layers formed on the first electrode; a conductive semiconductor layer formed on the plurality of semiconductor layer and provided with an outer surface having a tilt angle of a designated degree; and a second electrode formed on the conductive semiconductor layer.

12 Claims, 9 Drawing Sheets

LED HAVING VERTICAL STRUCTURE AND METHOD FOR FABRICATING THE SAME

This application claims the benefit of Korean Patent Application No. 10-2005-0123857, filed on Dec. 15, 2005, and Korean Patent Application No. 10-2006-0063586, filed on Jul. 6, 2006, which are hereby incorporated by references as if fully set forth herein.

BACKGROUND OF THE INVENTION

1. Field of the Invention

The present invention relates to a light emitting diode (LED) having a vertical structure, and more particularly, to an LED having a vertical structure for improving light emitting efficiency and a method for fabricating the same.

2. Discussion of the Related Art

Light emitting diodes (LEDs) are well-known semiconductor light-emitting devices which convert electric current into light energy. The LEDs have been used as light sources for display images of electronic equipment including information communication equipment, in conjunction with green LEDs using GaP:N semiconductors, starting from the commercialization of red LEDs using GaAsP semiconductors in 1962.

The wavelength of light emitted by such LEDs is dependent upon kinds of the semiconductor materials used in the manufacture of the LEDs. This is because the wavelength of emitted light is dependent upon the band-gap of the semiconductor materials representing an energy difference between valence-band electrons and conduction band electrons.

Gallium nitride (GaN) has a high thermal stability and a broad band gap (ranging from 0.8 to 6.2 eV), and therefore has received a great deal of attention in fields for the development of high-power output electronic devices. One of the reasons why the gallium nitride has attracted a great deal of interest is because it is possible to fabricate semiconductor layers emitting green, blue and white light, by using GaN in combination with other elements such as indium (In), aluminum (Al) and the like.

Due to the capability to control an emitted wavelength via the use of GaN, the emitted wavelength may be adjusted to a desired range suited for intrinsic properties of the materials used in compliance with the characteristics of specific equipment. For example, the use of GaN makes it possible to manufacture blue LEDs which are beneficial for optical writing and white LEDs which are capable of substituting incandescent lamps.

Green LEDs initially used GaP, which is an indirectly transitional material and has a low efficiency, and thus cannot emit pure green light. However, a green LED having high brightness was achieved by the success of the growth of an InGaN thin film.

Due to the above and other advantages of such GaN-based materials, a GaN-based LED market is rapidly growing. Accordingly, technologies of GaN-based optoelectronic devices have rapidly advanced from commercial introduction thereof in 1994.

As described above, nitride-based semiconductors, such as InGaN-based semiconductors, are directly transitional materials, thus being capable of forming LEDs having high brightness. However, due to high lattice mismatch and a difference of coefficients of thermal expansion with a different kind of substrate, the nitride-based semiconductors may have many defects in crystals. This is a problem awaiting solution.

That is, since substrates made of GaN-based materials cannot be easily manufactured and are expensive, when a light emitting device, such as an LED or an LD, is fabricated, a different kind of substrate, i.e., a sapphire substrate, is usually used.

However, when a GaN-based material is grown on the above substrate, defects, such as lattice mismatch or threading dislocation, may occur in the grown thin film due to a difference of coefficients of thermal expansion or a difference of lattice constants of crystal.

Accordingly, in order to fabricate a high-quality GaN-based LED, a GaN substrate having an excellent crystal structure is required.

Recently, a technique, which makes a freestanding GaN substrate using a hydride vapor phase epitaxy (HVPE) method, is being commercially used. However, such a technique still has many problems, such as bowing of the substrate and high production costs.

As a result, in order to fabricate an LED having the above structure, techniques, which reduce lattice defects or crystal defects, have been required.

SUMMARY OF THE INVENTION

Accordingly, the present invention is directed to an LED having a vertical structure and a method for fabricating the same that substantially obviate one or more problems due to limitations and disadvantages of the related art.

An object of the present invention is to provide an LED having a vertical structure and a method for fabricating the same, in which a light emitting device structure is grown on a substrate at selective regions and a nitride semiconductor layer selectively grown on the substrate for forming the light emitting device structure has various shapes, thereby improving light extraction efficiency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a light emitting diode (LED) includes forming a mask layer on a substrate; forming a conductive semiconductor layer on the mask layer; forming a plurality of semiconductor layers on the conductive semiconductor layer; forming a first electrode on the plurality of semiconductor layers; forming a support layer on the first electrode; separating the substrate; and forming a second electrode on the surface of the conductive semiconductor layer, exposed by the separation of the substrate.

In another aspect of the present invention, a light emitting diode (LED) having a vertical structure includes a support layer; a first electrode formed on the support layer; a plurality of semiconductor layers formed on the first electrode; a conductive semiconductor layer formed on the plurality of semiconductor layers, and provided with an outer surface having a tilt angle of a designated degree; and a second electrode formed on the conductive semiconductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 1 is a sectional view illustrating a state in which a mask layer is formed;

FIGS. 2 and 3 are sectional views illustrating a process for forming the mask layer;

FIG. 4 is a sectional view illustrating a state in which a gallium nitride layer is formed;

FIG. 5 is a sectional view illustrating a state in which semiconductor layers is formed;

FIG. 6 is a sectional view illustrating a state in which reflective ohmic electrodes are formed;

FIG. 7 is a sectional view illustrating a state in which first electrodes are formed;

FIG. 8 is a sectional view illustrating a state in which a support layer is formed;

FIG. 9 is a sectional view illustrating a state in which a substrate is separated from the semiconductor layers and second electrodes are formed on the semiconductor layers;

FIG. 10 is a sectional view illustrating individual devices; and

FIG. 11 is a sectional view illustrating a process for forming a mask layer;

FIG. 12 is a plan view illustrating a state in which the mask layer is formed;

FIG. 13 is a sectional view taken along the line A-A of FIG. 12;

FIG. 14 is a SEM image illustrating one example of conductive semiconductor layer growth;

FIG. 15 is a SEM image illustrating another example of conductive semiconductor layer growth;

FIG. 16 is a sectional view illustrating a thin film growth structure of the LED; and FIG. 17 is a sectional view of a structure of the LED.

DETAILED DESCRIPTION OF THE INVENTION

Figure 1:
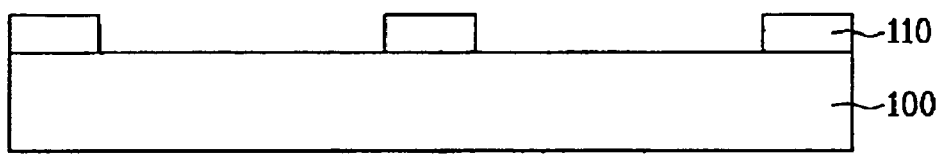
FIGS. 1 to 10 are views for illustrating a method for fabricating an LED having a vertical structure in accordance with a first embodiment of the present invention, and more specifically.

While the invention is susceptible to various alterations and modifications, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like numbers refer to like elements throughout the description of the drawings. In the drawings, the thickness of layers and the sizes of regions are exaggerated for clarity. Further, each of the embodiments, which will be described herein, includes complementary embodiments.

It will be understood that when an element, such as a layer, region or substrate, is referred to as being "on" another element, it can be directly on the other element or intervening elements may also be present. It will also be understood that if part of an element, such as a surface, is referred to as "inner", it is farther to the outside of the device than other parts of the element.

Further, the relative term "beneath" or "overlies" may be used to describe the relation of one layer or region in relation to a substrate or a reference layer or the relation of one layer or region to another layer or region as shown in the drawings.

It will be understood that these terms are intended to encompass different orientations of the device in addition to the orientation depicted in the drawings. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

These terms are used to separate one element, component, region, layer or section from a different region, layer or section. Accordingly, a first region, layer or section, which will be described below, may be named a second region, layer or section.

First Embodiment

Hereinafter, with reference to the annexed drawings, a first embodiment of the present invention will be described.

As shown in FIG. 1, a mask layer 110 is formed on the upper surface of a substrate 100 at remaining regions except for a plurality of device regions, thereby exposing the device regions.

The substrate 100 is one selected from the group consisting of a sapphire ($Al_2O_3$) substrate, a silicon (Si) substrate, a silicon carbide (SiC) substrate, a sapphire substrate, on which a nitride-based semiconductor layer is formed, a silicon substrate, on which a nitride-based semiconductor layer is formed, and a silicon carbide substrate, on which a nitride-based semiconductor layer is formed.

The mask layer 110 is formed by a plasma enhanced chemical vapor deposition (PECVD) method or with a depositing apparatus, such as a sputter.

Preferably, the mask layer 110 is made of a material, on which a nitride-based semiconductor layer, such as gallium nitride, is not grown. For example, the mask layer 110 is made of silicon oxide (for example, $SiO_2$), or silicon nitride (for example, $Si_3N_4$).

In order to form the mask layer 110 only at the selective regions, a patterning process using photo-lithography is required.

Figure 2:
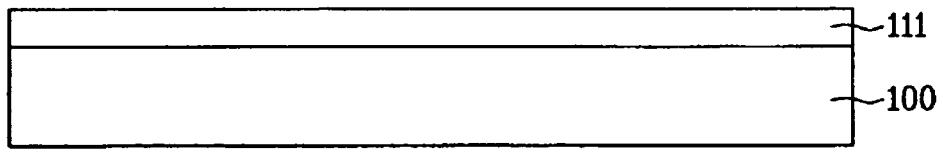

First, as shown in FIG. 2, a mask material 111 is formed on the upper surface of the substrate 100. The mask material 111 is formed by the PECVD method or with the depositing apparatus, such as a sputter.

Figure 3:
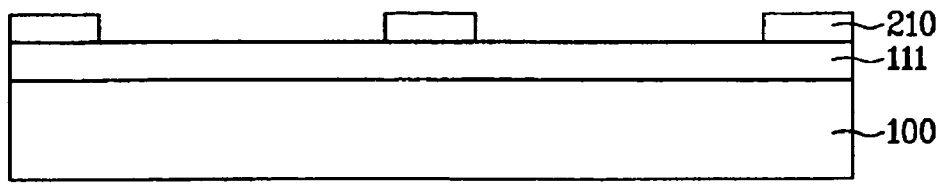

Thereafter, as shown in FIG. 3, a photoresist 210 is deposited on the upper surface of the mask material 111, and is etched into a device pattern through photo-lithography.

The photo-lithography refers to a process for forming a pattern using light, and requires a photoresist material as a photosensitive agent.

A photoresist 210 is applied to the upper surface of the mask material 111. The upper surface of the photoresist 210 is exposed to light through another mask having a device pattern, is developed, and is etched. Thereby, a pattern of the photoresist 210 is obtained.

For reference, in order to develop regions, which are exposed to light, a positive photoresist is used, and in order to develop regions, which are not exposed to light, a negative photoresist is used.

After the mask material 111 is etched through the device pattern of the photoresist 210, the photoresist 210 is removed. Then, the mask layer 110, as shown in FIG. 1, remains on the substrate 100.

Here, the etching of the mask material 111 is carried out by dry etching or wet etching.

Figure 4:
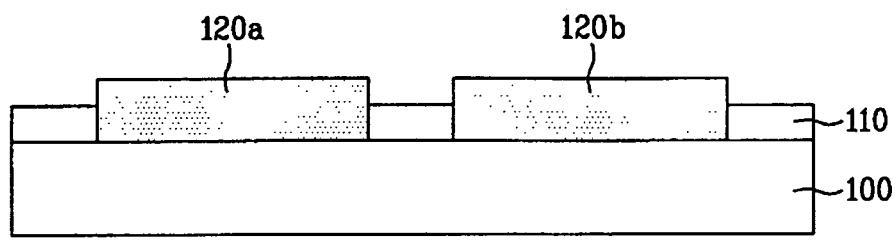

Thereafter, as shown in FIG. 4, gallium nitride layers 120a and 120b are respectively formed on the exposed regions of the upper surface of the substrate 100.

Preferably, the gallium nitride layers 120a and 120b are conductive, and are formed by a hydride vapor phase epitaxy (HVPE) method.

Further, preferably, the gallium nitride layers 120a and 120b have a thickness of 1~300 μm.

Figure 5:
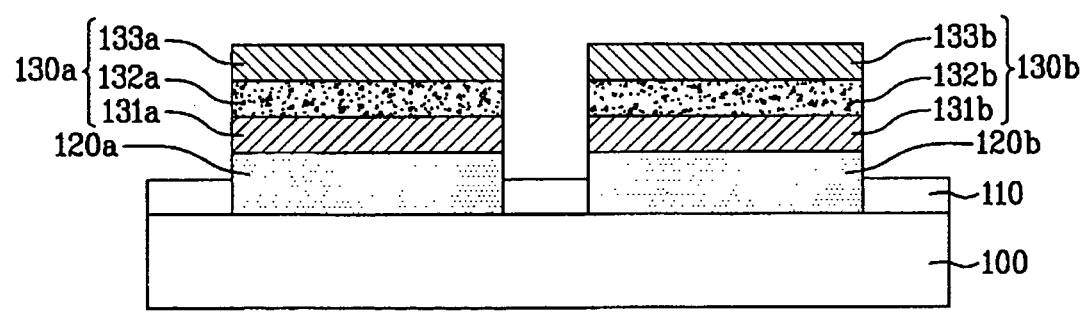

Thereafter, as shown in FIG. 5, a plurality of semiconductor layers 130a and 130b including active layers 132a and 132b are respectively formed on the upper surfaces of the gallium nitride layers 120a and 120b.

More specifically, the semiconductor layers 130a and 130b are formed by sequentially stacking n-type semiconductor layers 131a and 131b, the active layers 132a and 132b, and p-type semiconductor layers 133a and 133b.

Preferably, the semiconductor layers 130a and 130b are gallium nitride-based semiconductor layers ($Al_xIn_yGa_{1-x-y}N$ layer: $0 \leq (x,y) \leq 1$). These semiconductor layers 130a and 130b are grown by a metal organic chemical vapor deposition (MOCVD) method.

Figure 6:
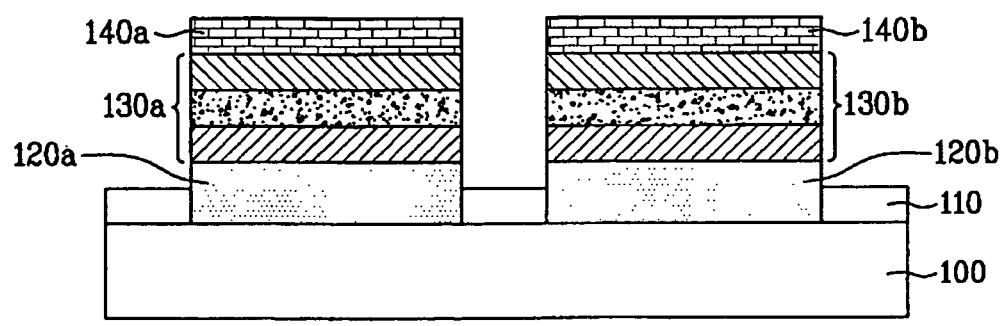

As shown in FIG. 6, reflective ohmic electrodes 140a and 140b are respectively formed on the upper surfaces of the semiconductor layers 130a and 130b.

Figure 7:
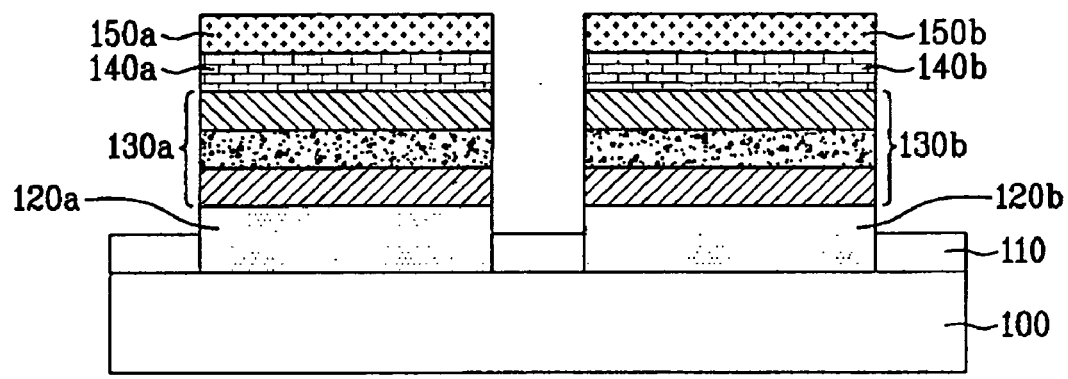
Figure 8:
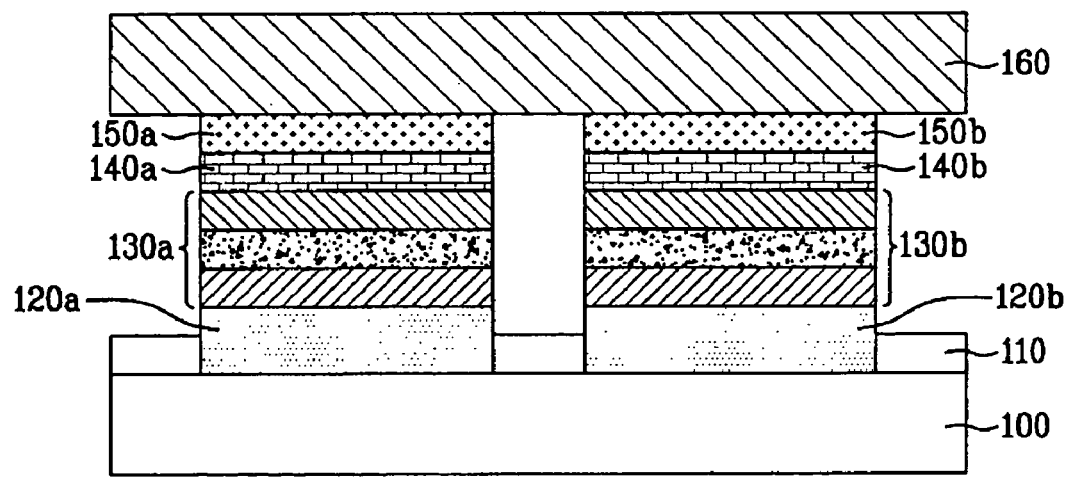

Thereafter, as shown in FIG. 7, first electrodes 150a and 150b are respectively formed on the upper surfaces of the reflective ohmic electrodes 140a and 140b, and as shown in FIG. 8, a support layer 160 is formed on the upper surfaces of the first electrodes 150a and 150b.

According to circumstances, the support layer 160 is formed directly on the upper surfaces of the reflective ohmic electrodes 140a and 140b without forming the first electrodes 150a and 150b on the upper surfaces of the reflective ohmic electrodes 140a and 140b (not shown).

Preferably, the support layer 160 is made of one selected from the group consisting of a semiconductor substrate, such as silicon (Si), gallium arsenide (GaAs) or germanium (Ge), a metal substrate, such as Cu or W, a substrate including metal, and is bonded to the upper surfaces of the first electrodes 150a and 150b.

Further, the support layer 160 may be formed by plating the upper surfaces of the first electrodes 150a and 150b with a metal, such as nickel (Ni) or copper (Cu).

Figure 9:
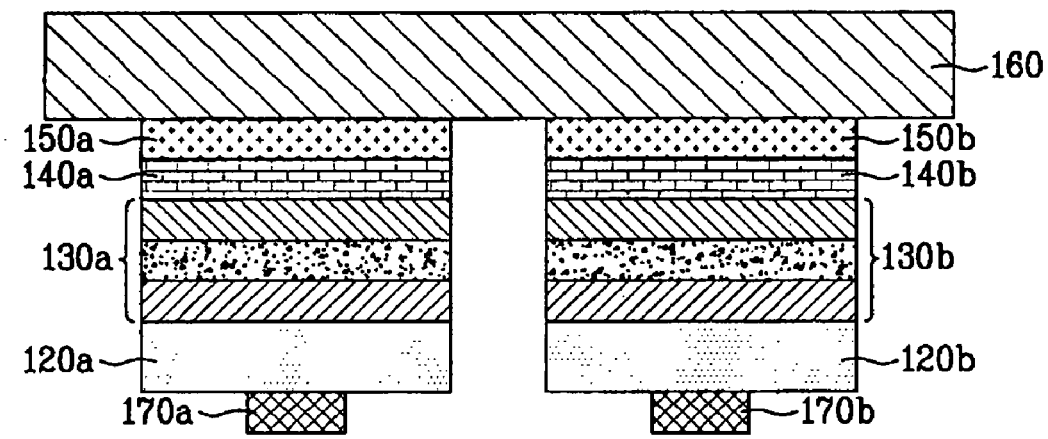

Thereafter, as shown in FIG. 9, the substrate 100 is removed, thereby exposing the lower surfaces of the gallium nitride layers 120a and 120b. Second electrodes 170a and 170b are respectively formed on the exposed lower surfaces of the gallium nitride layers 120a and 120b.

The substrate 100 is removed by a laser lift-off process or a wet etching process.

Figure 10:
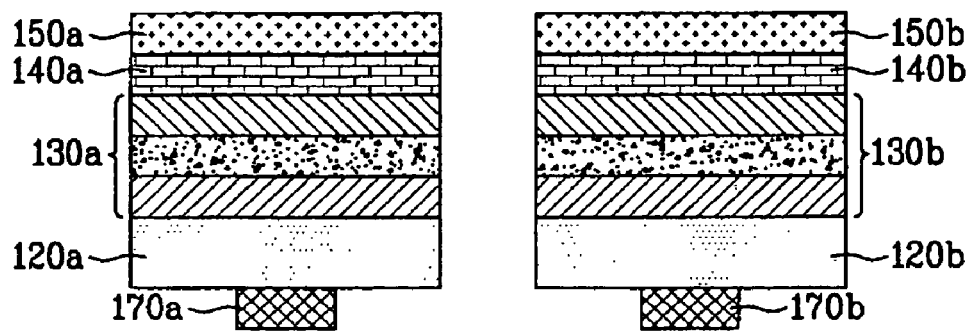

Thereafter, as shown in FIG. 10, the support layer 160 is removed from the first electrodes 150a and 150b.

Thereby, light emitting devices 180a and 180b, which are connected, are divided into separate unit chips.

In the LED having a vertical structure, which is fabricated by the above process of the present invention, the edge of the gallium nitride layer, which is grown by the HVPE method, is vertical to or tilts at a designated angle against the surface of the substrate according to the growth position or conditions.

Thereby, the LED effectively emits light to the outside, thus having an improved light extraction efficiency.

Since the gallium nitride layer is selectively grown on the upper surface only at device regions and the semiconductor layers are grown on the gallium nitride layer, it is possible to minimize the bowing of the light emitting device structure and lattice defects and crystal defects of the structure. Accordingly, the LED having a vertical structure has an improved reliability.

Further, a dry etching process for dividing the light emitting device structure into individual diodes is omitted. Thus, a process for fabricating the LED is simplified.

Since the gallium nitride layer is thick, threading dislocation is reduced to $5 \times 10^8$ cm$^{-2}$ or less, and, when a light emitting device structure is grown using a metal organic chemical vapor deposition (MOCVD) method, crystal defects are minimized. Accordingly, it is possible to improve the internal efficiency and the reliability of the LED.

The above-fabricated LED having a vertical structure, like the commonly-known LED having a vertical structure, has high current spreading, i.e., high uniformity of current, and an improved thermal property using metal and a semiconductor substrate made of silicon (Si), germanium (Ge), or gallium arsenide (GaAs) having high thermal conductivity, instead of a sapphire substrate having low thermal conductivity, without increasing a light emitting area. Further, the LED has a reduced size, and thus the number of LEDs per wafer is increased.

Second Embodiment

Hereinafter, with reference to the annexed drawings, a second embodiment of the present invention will be described.

Figure 11:
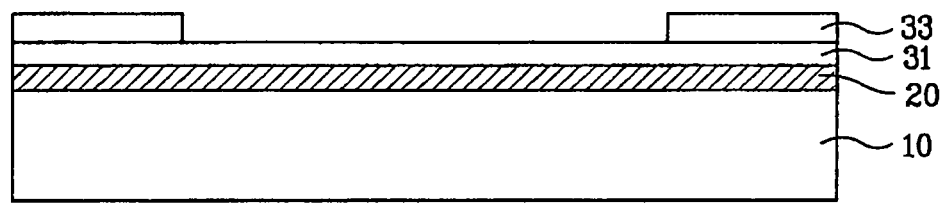
FIGS. 11 to 17 are views for illustrating a method for fabricating an LED having a vertical structure in accordance with a second embodiment of the present invention, and more specifically.

As shown in FIG. 11, a dielectric layer 30 using a dielectric material, such as silicon oxide ($SiO_2$) or silicon nitride ($SiN_x$), is formed on the upper surface of a substrate 10.

The substrate 10 may be a different kind of substrate made of sapphire ($Al_2O_3$), silicon (Si), silicon carbide (SiC) or lithium aluminate ($LiAlO_2$), or otherwise may be the same kind of substrate made of gallium nitride (GaN).

The gallium nitride substrate 10 is formed using a hydride vapor phase epitaxy (HVPE) method. Using the HVPE method, the high-quality gallium nitride substrate 10 having a proper thickness is obtained.

The dielectric layer 31 may be grown directly on the substrate 10, or may be grown on a buffer layer 20, which is obtained by growing $In_xAl_yGa_{(1-y-x)}N$ ($0 \leq (x,y) \leq 1$) to a designated thickness by a metal organic chemical vapor epitaxy (MOCVD), molecular beam epitaxy (MBE), or hydride vapor phase epitaxy (HVPE) method. Hereinafter, a structure of the dielectric layer 31 formed on the buffer layer 20 will be described.

The dielectric layer 31 is formed on the substrate 10 or the buffer layer 20 by depositing a dielectric material, such as silicon oxide ($SiO_2$) or silicon nitride ($SiN_x$), by a plasma enhanced chemical vapor deposition (PECVD) method or with a depositing apparatus, such as a sputter.

A photoresist 33 is applied to the upper surface of the dielectric layer 31. Thereby, the dielectric layer 31 has a pattern 32, as shown in FIG. 12.

The dielectric layer 31 having the pattern 32 forms a mask layer 30, which allows a gallium nitride semiconductor to be grown on specifically selected regions.

Here, the pattern 32 of the dielectric layer 31 is formed through photo-lithography.

Figure 12:
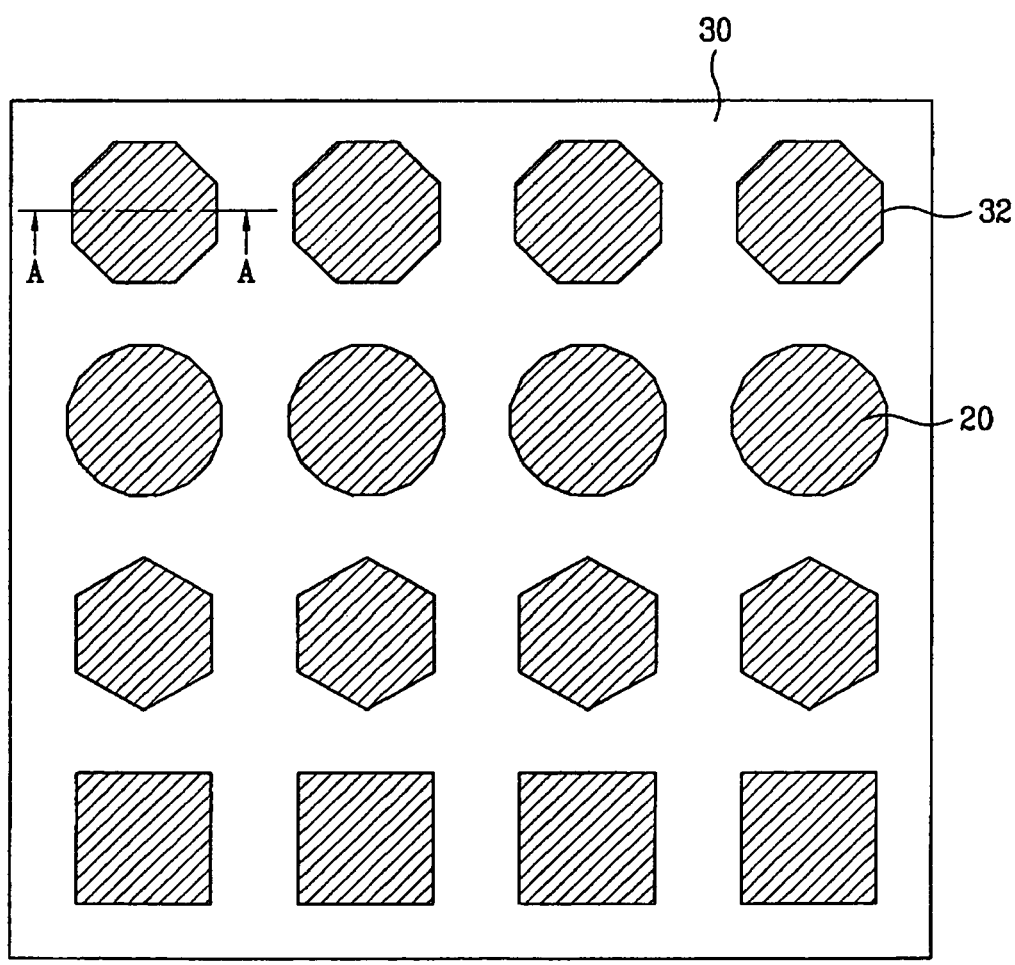

As shown in FIG. 12, the pattern 32 may have one plane shape selected from the group consisting of a circle and polygons including a rectangle, a hexagon, an octagon, a dodecagon, an icosikaitetragon and the like.

Figure 13:
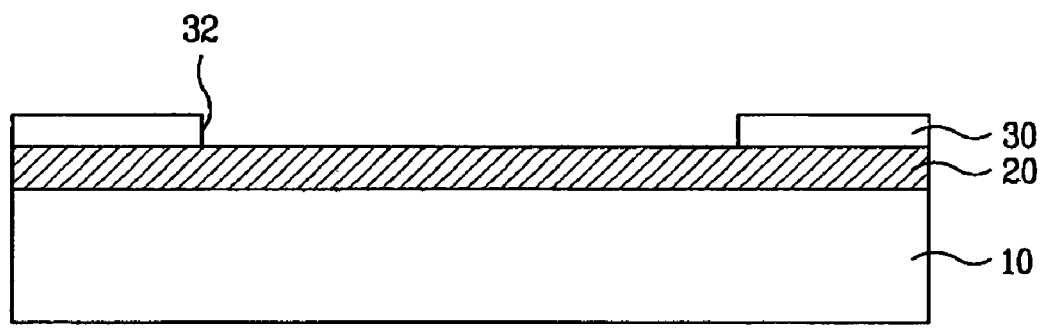

FIG. 13 illustrates a sectional structure of the pattern 32 of the mask layer 30 (taken along the line A-A).

The polygonal pattern 32 of the mask layer 30 serves to form a gallium nitride semiconductor template having a specific polygonal pillar shape on the buffer layer 20 according to the shape of the pattern 32.

The pattern 32 is formed by dry etching or wet etching.

After the pattern 32 is formed by removing portions of the dielectric layer 31 from light emitting device regions, a template structure having a thickness of 1~300 μm is grown on the pattern 32 using a conductive semiconductor through the HVPE method.

A conductive semiconductor layer 40 serving as the template structure uses an n-type gallium nitride semiconductor layer, and preferably has a thickness of 10~100 μm.

The above-described thin film growth using the HVPE method has a growth speed of approximately 50 μm per hour, and is beneficial to growth of a relatively thick layer, such as the conductive semiconductor layer 40.

Generally, the conductive semiconductor layer 40 has the same horizontal sectional shape as the plane shape of the pattern 32 of the mask layer 30. However, the conductive semiconductor layer 40 may have a different horizontal sectional shape from the plane shape of the pattern 32 of the mask layer 30 by changing the growth conditions of the conductive semiconductor layer 40.

During growing, the shape of the conductive semiconductor layer 40 is adjusted by varying growth speed, pressure, mixing ratio of components, V/III ratio (i.e., ratio of a V-group material, such as N, to an III-group material, such as Ga), growth time, and growth temperature.

Figure 14:
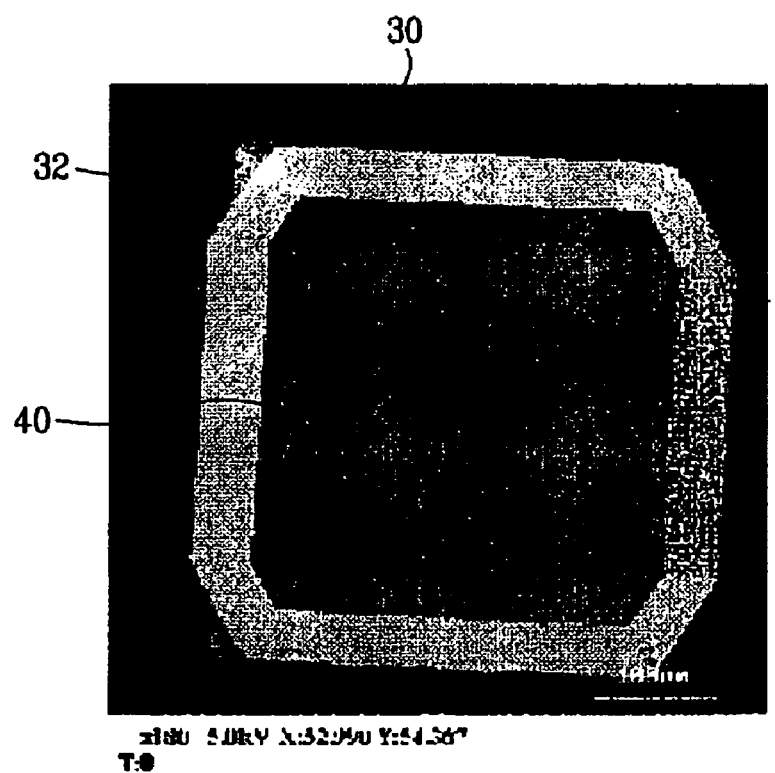

For example, as shown in FIG. 14, the conductive semiconductor layer 40, which is grown on the pattern 32 having a polygonal plane shape less than a hexagon, may have a polygonal sectional shape more than an octagon.

Figure 15:
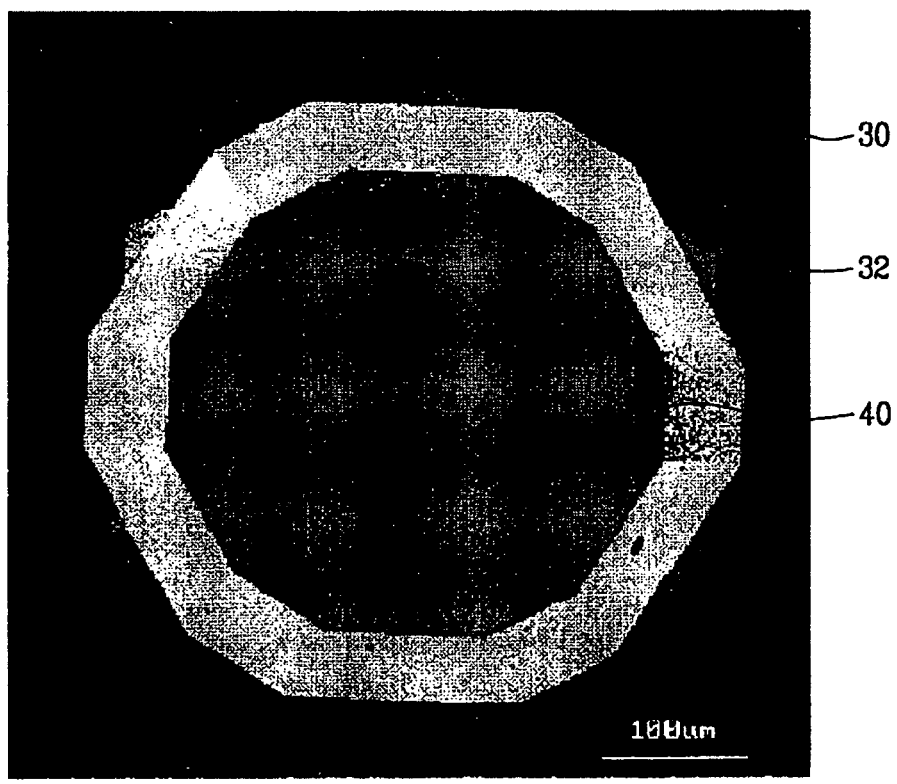

Further, as shown in FIG. 15, the conductive semiconductor layer 40, which is grown on the pattern 32 having a hexagonal plane shape, may have a dodecagonal sectional shape.

FIGS. 14 and 15 are scanning electron microscopy (SEM) images of the conductive semiconductor layers 40, which are respectively grown on the mask layers 30.

Compared with the rectangular or hexagonal sectional shape of the conductive semiconductor layer 40, the above polygonal sectional shape of the conductive semiconductor layer 40, which is more than an octagon, when the LED emits light, reduces a possibility of internal total reflection of the light, thus improving light extraction efficiency.

In case that the conductive semiconductor layer 40 has a polygonal sectional shape, which is more than an octagon, it is possible to improve the light extraction efficiency of the LED. More preferably, the conductive semiconductor layer 40 has a circular sectional shape or an elliptical shape. However, preferably, in consideration of the forming process of the conductive semiconductor layer 40, the conductive semiconductor layer 40 has a polygonal sectional shape, which is in the range of an octagon to an icosikaitetragon.

A structure formed on the conductive semiconductor layer 40 having a polygonal sectional shape, which is more than a rectangle, has substantially the same sectional shape as that of the conductive semiconductor layer 40.

In case that the conductive semiconductor layer 40 serving as the nitride template is grown on the limited pattern 32, the side surface of the conductive semiconductor layer 40 forms a tilt angle due to crystal characteristics thereof. The tilt angle is determined in the range of 35~65°.

The tilt angle is adjusted by varying the above-described growth conditions.

Figure 16:
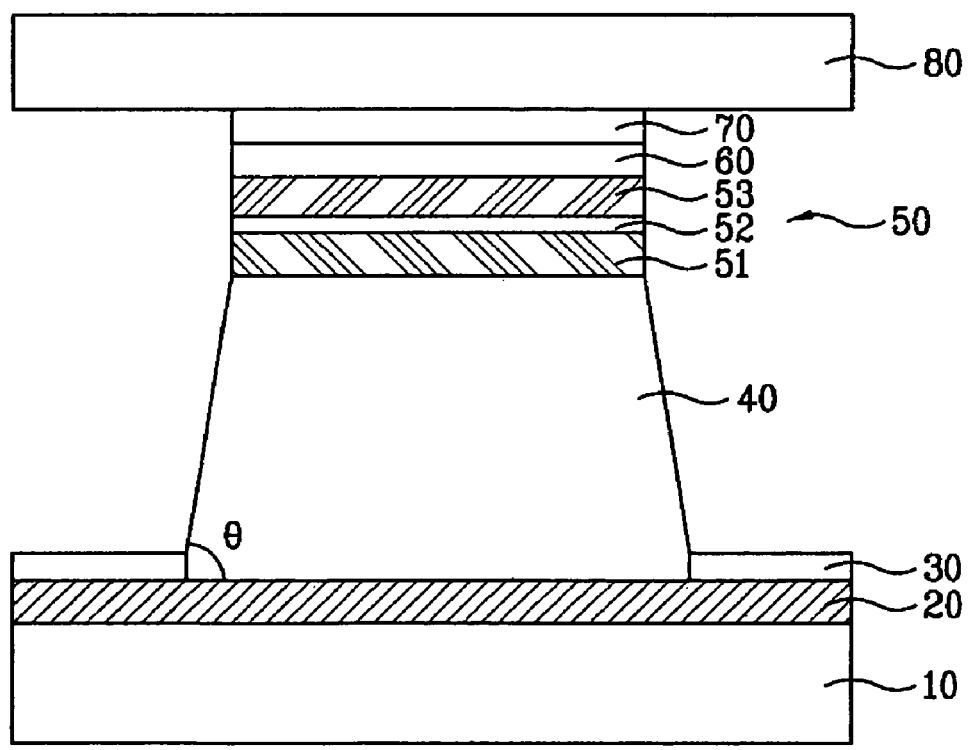

As shown in FIG. 16, a light emitting device structure 50 including semiconductor layers is grown on the conductive semiconductor layer 40 using a MOCVD method.

As shown in FIG. 16, the side surface of the conductive semiconductor layer 40 serving as the nitride template has a tilt angle (θ) of approximately 35~65°, and preferably 53~56° from a horizontal plane.

Thereafter, an n-type semiconductor layer 51, an active layer 52, and a p-type semiconductor layer 53 using GaN are sequentially formed on the conductive semiconductor layer 40.

Here, the n-type semiconductor layer 51, the active layer 52, and the p-type semiconductor layer 53 may be formed in reverse order. That is, the p-type semiconductor layer 53, the active layer 52, and the n-type semiconductor layer 51 may be sequentially formed on the conductive semiconductor layer 40. In this case, the conductive semiconductor layer 40 uses a p-type semiconductor layer.

Particularly, the light emitting device structure 50 uses a gallium nitride-based semiconductor. In this case, the active layer 52 has an InGaN/GaN quantum well (QW) structure.

Further, other materials, such as AlGaN and AlInGaN, may be used as the active layer 52. When an electric field is applied to the active layer 52, light is generated from the active layer 52 based on electron-hole combination pairs.

Further, the active layer 52 may have a multi quantum well (QW) structure having a plurality of the above quantum wells (QWs).

A p-type electrode 60 is formed on the light emitting device structure 50. Here, the p-type electrode 60 is an ohmic electrode. A reflective electrode 70 for reflecting light generated from the active layer 52 to emit the light to the outside is formed on the p-type electrode 60.

According to the selection of a material for the p-type electrode 60 and the reflective electrode 70, one electrode may serve both as the p-type electrode 60 and the reflective electrode 70.

A support layer 80 for supporting the light emitting device structure 50 during separating the substrate 10 is formed on the reflective electrode 70.

The support layer 80 may be formed by bonding a semiconductor substrate, such as silicon (Si), gallium arsenide (GaAs) or germanium (Ge), or a metal substrate, such as Cu or W, to the upper surface of the reflective electrode 70. Further, the support layer 80 may be formed by plating the upper surface of the reflective electrode 70 with a metal, such as nickel (Ni) or copper (Cu).

In case that the support layer 80 is made of a metal, in order to increase the adhesive power of the support layer 80 to the reflective electrode 70, a seed metal may be used.

Thereby, the light emitting structure 50, as shown in FIG. 16, is obtained.

Thereafter, the substrate 10, the buffer layer 20, and the mask layer 30 are removed.

Figure 17:
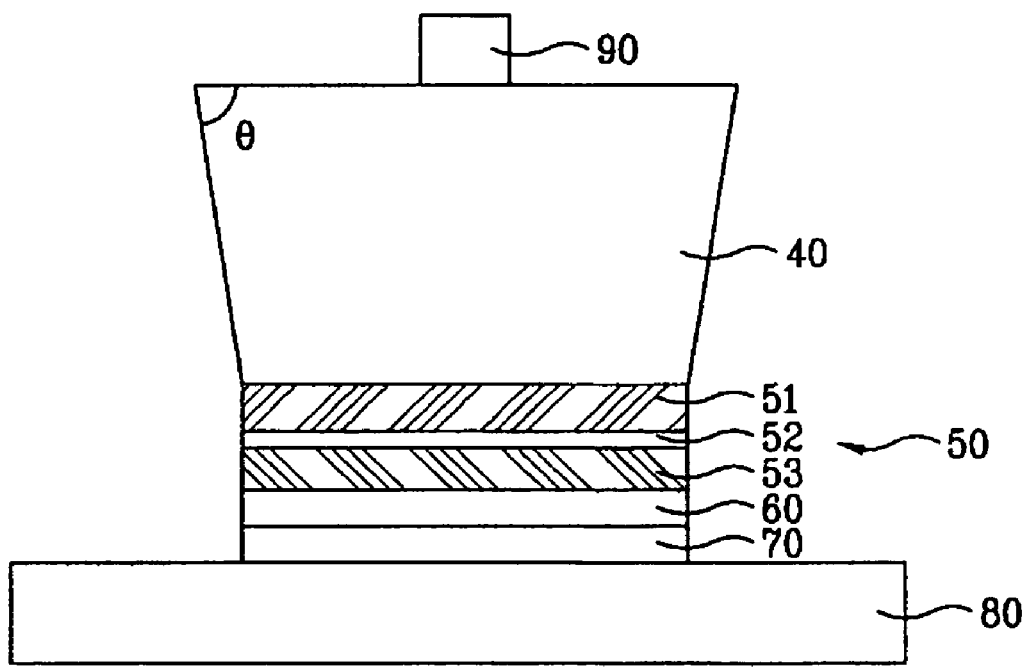

Under the condition that the substrate 10, the buffer layer 20, and the mask layer 30 are removed, the whole structure is reversed, and an n-type electrode 90 is formed on the outer surface of the conductive semiconductor layer 40, which is exposed through the above removal process. Thereby, an LED having a vertical structure, as shown in FIG. 17, is obtained.

Since the whole structure is reversed as described above, the upper surface and the side surface of the conductive semiconductor layer 40 meet at an angle of 53~56°.

The substrate 10 may be removed using a laser through a laser lift-off process or may be chemically removed by etching.

During removal of the substrate 10, the support layer 80 supports the light emitting device structure 50.

The buffer layer 20 and the mask layer 30 are removed by dry etching or wet etching. Thereafter, the exposed surface of the conductive semiconductor layer 40 is chemically or mechanically finished.

The above-fabricated LED having a vertical structure, compared to the conventional LED having a horizontal structure, has improved current spreading, i.e., improved uniformity of current, and an improved light emitting property by using metal and a semiconductor substrate made of silicon (Si), germanium (Ge), or gallium arsenide (GaAs) having high thermal conductivity, instead of a sapphire substrate having low thermal conductivity.

As described above, in crystal growth employing selective area growth (SAG) using the mask layer 30 made of a thin film of a dielectric, such as silicon oxide ($SiO_2$) or silicon nitride ($SiN_x$), the above-described head-cut reversed pyramid structure is obtained using the shape of the template according to the growth conditions and the crystal orientation.

The more multi-sided sectional shape the conductive semiconductor layer 40, serving as the template, has, the higher the light extraction efficiency of the LED becomes. This fact was proved in an experiment in which an LED with a semiconductor layer having a rectangular sectional shape and an LED with a semiconductor layer having a hexagonal sectional shape were compared to each other.

Preferably, the conductive semiconductor layer 40, serving as the template, has an angle of approximately 55° in consideration of related conditions, such as a reflective index of a GaN material and a reflective index in air. When the upper surface and the side surface of the conductive semiconductor layer 40 meet at an angle of 53~56°, as described above, the light extraction efficiency of the LED is significantly improved.

Accordingly, the growth rate and the growth orientation of the facet of crystal of the conductive semiconductor layer 40 can be adjusted using the shape of the pattern 32 of the mask layer 30 and the above various growth variables. As a result, it is possible to make templates having various shapes. Further, the LED is developed to a structure for maximizing light extraction efficiency.

It will be apparent to those skilled in the art that various modification and variations can be made in the present inventions without departing from the spirit or scope of the inventions. Thus, it is intended that the present invention covers the modifications and variations of this invention provided they come without the scope of the appended claims and their equivalents.

What is claimed is:

1. A light emitting diode (LED) having a vertical structure comprising:

a support layer;

a first electrode on the support layer, the first electrode comprising an electrical contact and a reflective electrode on the electrical contact;

a semiconductor structure on the first electrode, the semiconductor structure including a first-type layer, an active layer, and a second-type layer;

a conductive semiconductor layer directly on the semiconductor structure, and provided with an outer surface having a tilt angle in the range of 35~65°; and a second electrode on a surface of the conductive semiconductor layer, wherein the conductive semiconductor layer is configured to emit the light from the semiconductor structure through the surface of the conductive semiconductor layer, and wherein the outer surface of the conductive semiconductor layer is configured to reduce a possibility of internal total reflection of the light emitted from the semiconductor structure thereby improving the light extraction efficiency of the diode.

2. The LED according to claim 1, wherein the tilt angle of the outer surface of the conductive semiconductor layer is an angle between an upper surface and a side surface of the conductive semiconductor layer.

3. The LED according to claim 1, wherein the conductive semiconductor layer comprises a conductive GaN layer having a thickness of 1~300 μm.

4. The LED according to claim 1, wherein at least one of the support layer, the first electrode, the semiconductor structure, the conductive semiconductor layer, and the second electrode has a horizontal sectional shape of a polygon, which is more than a rectangle.

5. The LED according to claim 4, wherein at least one of the support layer, the first electrode, the semiconductor structure, the conductive semiconductor layer, and the second electrode has a horizontal sectional shape of a polygon having at least 6 angles.

6. The LED according to claim 1, wherein the support layer comprises at least one of a silicon (Si) substrate, a gallium arsenide (GaAs) substrate, a germanium (Ge) substrate, a metal substrate, and a substrate including metal.

7. The LED according to claim 1, wherein the support layer comprises nickel (Ni) or copper (Cu).

8. The LED according to claim 1, wherein the thickness of the conductive semiconductor layer is thicker than that of the semiconductor structure.

9. The LED according to claim 1, further comprising a seed metal arranged between the support layer and the first electrode.

10. The LED according to claim 1, wherein an outer surface of the semiconductor structure has a different angle from the tilt angle of the outer surface of the conductive semiconductor layer.

11. The LED according to claim 1, wherein the tilt angle of the outer surface of the conductive semiconductor layer is an angle between an upper surface and a side surface of the conductive semiconductor layer, which is in the range of 53~56°.

12. The LED according to claim 1, wherein the tilt angle of the outer surface of the conductive semiconductor layer is configured such that the surface of the conductive semiconductor layer is larger than a surface of the conductive semiconductor layer contacting the semiconductor structure.

* * * * *